United States Patent
van Gemert et al.

(10) Patent No.: US 11,963,291 B2
(45) Date of Patent: Apr. 16, 2024

(54) EFFICIENT WAVE GUIDE TRANSITION BETWEEN PACKAGE AND PCB USING SOLDER WALL

(71) Applicant: NXP B.V., Eindhoven (NL)

(72) Inventors: Leo van Gemert, Nijmegen (NL); Michael B. Vincent, Chandler, AZ (US)

(73) Assignee: NXP B.V., Eindhoven (NL)

( * ) Notice: Subject to any disclaimer, the term of this patent is extended or adjusted under 35 U.S.C. 154(b) by 177 days.

(21) Appl. No.: 17/726,426

(22) Filed: Apr. 21, 2022

(65) Prior Publication Data

US 2023/0345623 A1   Oct. 26, 2023

(51) Int. Cl.
| | |
|---|---|
| H05K 1/02 | (2006.01) |
| H01L 21/48 | (2006.01) |
| H01L 21/56 | (2006.01) |
| H01L 23/00 | (2006.01) |
| H01L 23/31 | (2006.01) |
| H01L 23/498 | (2006.01) |
| H01L 23/66 | (2006.01) |
| H01P 3/12 | (2006.01) |
| H05K 1/11 | (2006.01) |

(Continued)

(52) U.S. Cl.
CPC ....... *H05K 1/0243* (2013.01); *H01L 21/4853* (2013.01); *H01L 21/563* (2013.01); *H01L 23/3157* (2013.01); *H01L 23/49838* (2013.01); *H01L 23/66* (2013.01); *H01L 24/16* (2013.01); *H01P 3/121* (2013.01); *H05K 1/0218* (2013.01); *H05K 1/111* (2013.01); *H05K 3/10* (2013.01); *H05K 3/3426* (2013.01); *H05K 3/4007* (2013.01); *H01L 2223/6627* (2013.01); *H01L 2223/6677* (2013.01); *H01L 2224/16227* (2013.01); *H01L 2924/18161* (2013.01); *H01L 2924/1903* (2013.01); *H05K 2201/10734* (2013.01)

(58) Field of Classification Search
CPC ........... H05K 2201/037; H05K 1/0243; H05K 1/0218
See application file for complete search history.

(56) References Cited

U.S. PATENT DOCUMENTS

| | | |
|---|---|---|
| 5,969,461 A | 10/1999 | Anderson et al. |
| 6,800,946 B2 | 10/2004 | Chason et al. |

(Continued)

FOREIGN PATENT DOCUMENTS

EP   3734321 A1   11/2020

OTHER PUBLICATIONS

Non-final office action dated Jan. 20, 2022 in U.S. Appl. No. 16/669,579).

(Continued)

*Primary Examiner* — Sherman Ng (57) ABSTRACT

A packaging assembly and methodology provide a PCB substrate with one or more waveguide apertures and a conductive pattern which includes a plurality of landing pads that are disposed around peripheral edges of each waveguide aperture and that are connected to one another by trace lines so that, upon attachment and reflow of solder balls to the plurality of landing pads, the solder balls reflow along the trace lines to form a fully closed solder waveguide shielding wall disposed around peripheral edges of the first waveguide aperture.

20 Claims, 8 Drawing Sheets

(51) Int. Cl.
*H05K 3/10* (2006.01)
*H05K 3/34* (2006.01)
*H05K 3/40* (2006.01)

(56) References Cited

U.S. PATENT DOCUMENTS

| | | |
|---|---|---|
| 8,169,060 B2 | 5/2012 | Maurer et al. |
| 8,507,376 B2 | 8/2013 | Ewert et al. |
| 8,796,075 B2 | 8/2014 | Babiarz et al. |
| 8,860,212 B1 | 10/2014 | Foong et al. |
| 9,136,230 B2 | 9/2015 | Demin et al. |
| 9,627,346 B2 | 4/2017 | Hsu et al. |
| 9,679,881 B2 | 6/2017 | Pagaila et al. |
| 2002/0060368 A1 | 5/2002 | Jiang |
| 2004/0103509 A1 | 6/2004 | Bidard et al. |
| 2004/0118599 A1 | 6/2004 | Chason |
| 2004/0195701 A1 | 10/2004 | Attarwala |
| 2007/0085635 A1 | 4/2007 | Tamaki |
| 2008/0044127 A1* | 2/2008 | Leising .................. G02B 6/43 385/14 |
| 2011/0147925 A1 | 6/2011 | van Kempen et al. |
| 2013/0012145 A1 | 1/2013 | Shibuya et al. |
| 2015/0321907 A1 | 11/2015 | Bowles et al. |
| 2015/0364830 A1 | 12/2015 | Tong et al. |
| 2017/0069605 A1 | 3/2017 | Yew et al. |
| 2017/0228529 A1 | 8/2017 | Huang et al. |
| 2017/0263578 A1* | 9/2017 | Ishibashi ................. H01L 24/16 |
| 2019/0086763 A1* | 3/2019 | Makurin ............... H01L 31/162 |
| 2020/0343612 A1 | 10/2020 | Shi |
| 2021/0134612 A1 | 5/2021 | Van Gemert et al. |

OTHER PUBLICATIONS

1 Notice of Allowance dated Sep. 28, 2022 in U.S. Appl. No. 16/669,579.
U.S. Appl. No. 18/064,641, filed Dec. 12, 2022, entitled "Selective Underfill Assembly and Method Therefor".
Final office action dated Jul. 6, 2022 in U.S. Appl. No. 16/669,579.
Leo Van Gemert, U.S. Appl. No. 16/669,579, filed Oct. 31, 19, Office Action dated Apr. 21, 2021.
Leo Van Gemert, U.S. Appl. No. 16/669,579, filed Oct. 31, 19, Final Office Action dated Aug. 31, 2021.

* cited by examiner

EFFICIENT WAVE GUIDE TRANSITION BETWEEN PACKAGE AND PCB USING SOLDER WALL

BACKGROUND OF THE INVENTION

Field of the Invention

The present invention is directed in general to the field of integrated circuit devices and packages. In one aspect, the present invention relates to electronic component packaging and method of manufacturing for an integrated circuit package having a radio frequency device.

Description of the Related Art

With integrated circuit packages which include radio frequency (RF) active and passive components, the integrated circuit package may be mounted to a printed circuit board (PCB) which can have other components and devices mounted on the PCB, such as a waveguide launcher or antenna elements. In order to implement a radio frequency coupling between the integrated circuit package and any PCB components or devices, the PCB may include waveguide apertures formed in the PCB substrate to promote radio frequency coupling between the integrated circuit package and any PCB components or devices. However, when integrated circuit packages are formed with multiple RF transmit and/or receive circuits that are aligned with corresponding waveguide apertures to connect to PCB components or devices (e.g., waveguide antennas) to form separate transmit/receive channels, radio frequency coupling can arise between different transmit/receive channels, thereby reducing signal efficiency and channel isolation. These design challenges and performance limitations, along with reliability problems, can be exacerbated by virtue of the packaging techniques which use discrete conductive elements, such ball grid array (BGA), the land grid array (LGA), and the pin grid array (PGA) conductors, to attach the integrated circuit package and PCB substrate. As a result, existing RF integrated circuit packaging techniques are extremely difficult at a practical level by virtue of the balancing performance, complexity, cost, and reliability requirements of providing RF integrated circuit packages.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An integrated circuit package assembly, apparatus, and fabrication method are described for attaching an integrated circuit package to one or more external waveguide structures using a printed circuit board (PCB) substrate having a patterned array of solder bridge trace lines and landing pads on a first surface of the PCB substrate. As formed, the solder bridge trace lines are positioned to surround the periphery of waveguide openings formed in the PCB substrate. In this configuration, a solder mask may be applied to the first surface of the PCB substrate which exposes the patterned array of solder bridge trace lines and landing pads, and an integrated circuit package having a ball grid array (BGA) is attached to the PCB substrate with the BGA solder ball conductors aligned for contact with the patterned landing pads. During application of a reflow or heating process, the BGA solder ball conductors which are positioned at the periphery of waveguide openings flow together along the solder bridge trace lines to form a closed solder wall between PCB substrate and integrated circuit package, thereby forming waveguide shielding walls around the waveguide openings which reduce radio frequency (RF) signal leakage between adjacent transmit or receive channels. In addition to providing shielding benefits, the waveguide shielding walls prevent underfill encapsulant materials from intruding into the waveguide openings of the PCB substrate, thereby enhancing reliability of the solder connection and extending the product lifetime.

By way of background to the present disclosure, integrated circuit packages which include integrated radio frequency (RF) circuits (e.g., receiver, transmitter, and/or transceiver circuits) are typically connected to a patterned array of landing pads on a PCB substrate using conductive bump structures. In order to implement a radio frequency coupling between the integrated circuit package and an external RF circuit or device (e.g., a waveguide antenna) formed in or on the PCB substrate, the PCB substrates typically include RF waveguides formed in the PCB substrate with one or more waveguide holes or apertures formed in alignment with the RF circuits to extend through the PCB substrate. With RF waveguides formed in the PCB substrate, the layout and arrangement of the landing pads on the PCB substrate and the conductive bump structures are controlled so that the conductive bump structures are distributed to surround the waveguide holes or apertures for making electrical connection between the landing pads and integrated circuit leads. In order to prevent the conductive bump structures (e.g., solder balls) from shorting together, a minimum spacing requirement is required for separating the landing pads and conductive bump structures. As a result, each waveguide hole or aperture will be surrounded by a plurality of separate conductive bump structures in which openings or gaps between the conductive bump structures provide an electrically and physically "open" structure which reduces signal efficiency and channel isolation since the RF signals being transmitted through the RF waveguides can "leak" through the openings or gaps. In addition to reducing the channel isolation and signal efficiency, the openings or gaps between the conductive bump structures prevent the ability to use underfill materials to adhesively bond surface mount integrated circuit packages to the PCB substrate since the underfill material can penetrate through the openings or gaps to intrude into RF waveguides.

Figure 1:
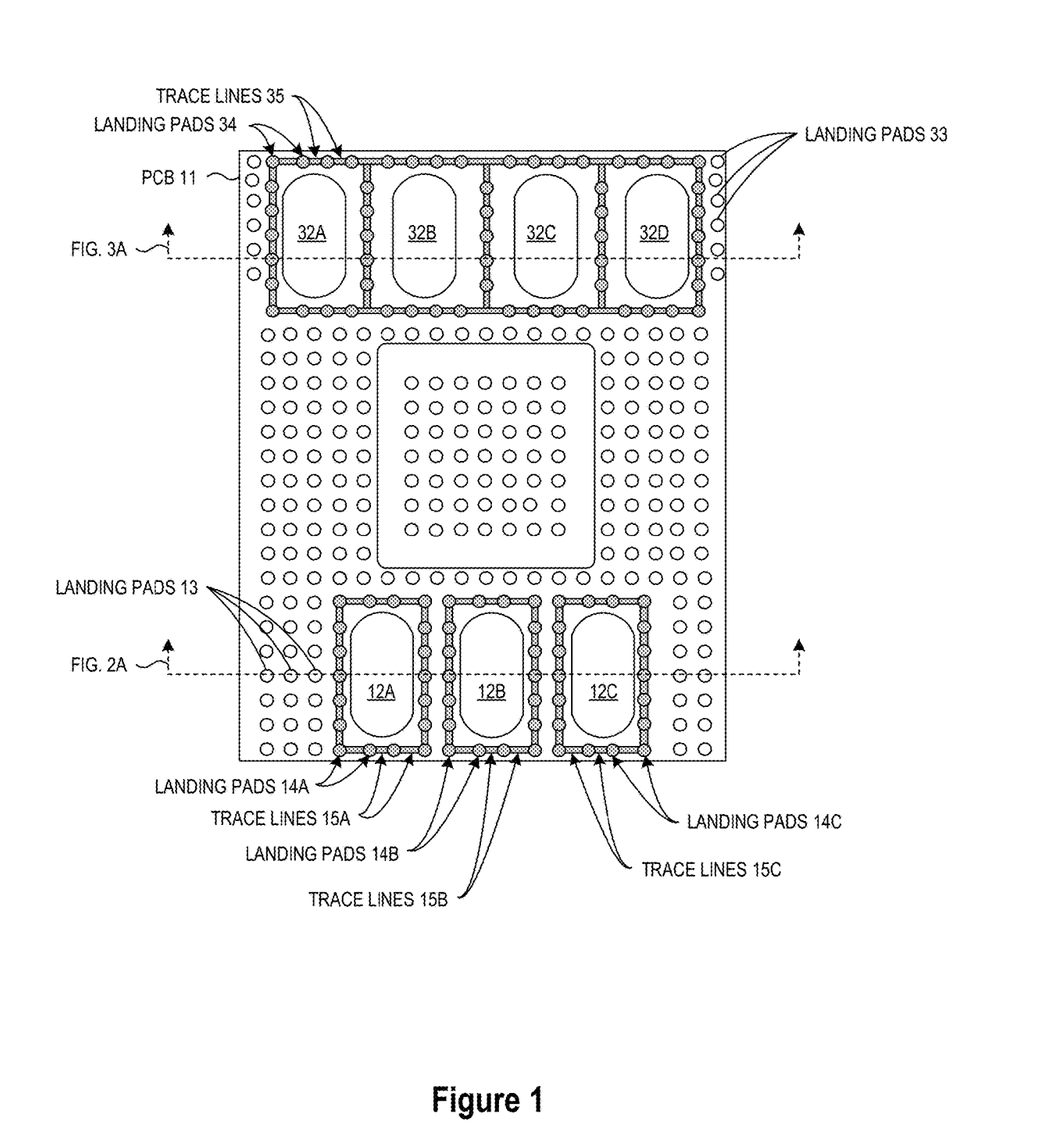
FIG. 1 depicts a plan view of a printed circuit board (PCB) substrate having waveguide apertures and patterned conductive landing pads and shield wall trace lines formed around the waveguide apertures on a first surface of the PCB substrate to illustrate selected embodiments of the present invention.

To provide additional details for an improved contextual understanding of the present disclosure, reference is now made to FIG. 1 which depicts a plan view 10 of a printed circuit board (PCB) substrate 11 in which waveguide apertures or openings 12, 32 are formed. On a first or top surface of the PCB substrate 11, an array of patterned conductive landing pads 13, 33 and shield wall landing pads and trace lines 14/15, 34/35 are formed. In particular, the layout of the patterned conductive landing pads 13, 33 is arranged on the top surface of the PCB substrate 11 to provide electrical connection to PCB conductor elements or vias (not shown) formed in the PCB substrate 11, thereby allowing subsequently-formed conductive bump structures (e.g., BGA solder balls) from an integrated circuit package to make electrical contact to the PCB conductor elements/vias. In similar fashion, the layout of the patterned conductive shield wall landing pads 14, 34 and trace lines 15, 35 is arranged to provide electrical connection to PCB conductor elements/vias (not shown) formed in the PCB substrate 11, and to also encircle and surround, respectively, the waveguide apertures or openings 12, 32.

In particular, a plurality of conductive contact pads or layers 14A-C are formed on the top surface of the PCB substrate 11 to surround each of the waveguide apertures or openings 12A-C. In addition, conductive trace layers 15A-C are formed on the top surface of the PCB substrate 11 to connect the conductive contact pads or layers 14A-C together, thereby providing a wettable surface between the conductive contact pads or layers 14A-C at the periphery of the waveguide apertures or openings 12. In the example depicted with reference to the waveguide apertures or openings 12A-C, each waveguide opening (e.g., 12A) has a separate set of patterned conductive shield wall landing pads (e.g., 14A) connected together by conductive trace lines (e.g., 15A). As indicated with the gray shading, the patterned conductive shield wall landing pads 14A-C and trace lines 15A-C are connected to a predetermined reference or supply voltage, such as ground, when in operational mode to provide the waveguide shielding benefits described more fully hereinbelow.

In another example, the patterned conductive shield wall landing pads 34 are formed on the top surface of the PCB substrate 11 to surround the waveguide apertures or openings 32A-D, but with only a single row of landing pads 34 positioned between adjacent waveguide openings. In addition, patterned conductive shield wall trace lines 35 are formed on the top surface of the PCB substrate 11 to connect the conductive contact pads or layers 34 together, thereby providing a wettable surface between the conductive contact pads or layers 34 at the periphery of the waveguide apertures or openings 32. As depicted, a single, contiguous set of patterned conductive shield wall landing pads 34 and trace lines 35 are formed to surround the waveguide openings (e.g., 32A-D). Again, the gray shading of the patterned conductive shield wall landing pads 34 and trace lines 35 indicates they are connected to a predetermined reference or supply voltage, such as ground, when in operational mode to provide the waveguide shielding benefits described more fully hereinbelow.

Figure 2A:
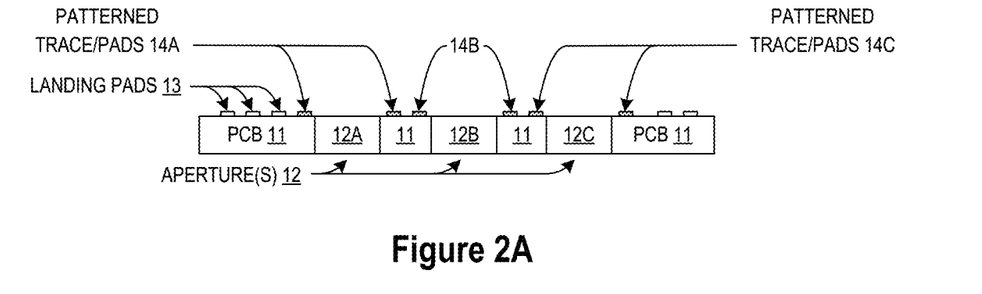
FIGS. 2A-F depict cross-sectional and plan views of a sequence of fabrication steps for attaching the PCB substrate to an integrated circuit package with a ball grid array before reflowing the ball grid array to form individual waveguide shielding walls around each waveguide aperture in accordance with selected first embodiments of the present disclosure

For an improved understanding of the present disclosure, reference is now made to FIG. 2A which shows a cross-sectional view (through line FIG. 2A of FIG. 1) of the PCB substrate 11 at a first stage of a package fabrication process in accordance with selected first embodiments of the present disclosure. The PCB substrate 11 may be initially formed with one or more dielectric material layers and may include patterned conductive via and/or lines to provide predetermined electrical connections to patterned landing pads 13, 14 formed on a first or top surface of the PCB substrate. Using standard PCB processing tools, waveguide openings or apertures 12A-C may be formed in the PCB substrate 11 at predetermined locations. By defining the locations of the waveguide openings or apertures 12A-C, a first set of RF waveguides may be positioned in the PCB substrate 11 for alignment with RF circuits formed in integrated circuit packages that are subsequently mounted or attached to the PCB substrate 11. On the first or top surface of the PCB substrate 11, a conductive pattern of landing pads 13, 14 and patterned trace lines 15 are formed for purposes of electrically and physically connecting to the (subsequently formed) solder balls of a (subsequently attached) integrated circuit package. For example, a first set of contact pads or layers 13 may be formed on the top surface of the PCB substrate 11 and electrically connected to one or more conductive vias (not shown) formed in the PCB substrate 11. In addition, a second set of patterned contact pads 14A-C and trace lines 15A-C are formed on the top surface of the PCB substrate 11 and positioned peripherally to the waveguide apertures or openings 12A-C. As will be appreciated, any suitable fabrication sequence may be used to form the conductive pattern of landing pads 13, 14 and patterned trace lines 15. For example, one or more conductive layers may be deposited (e.g., electroplated) on the PCB substrate 11, and then patterned and etched using photolithography processes to selectively etch the deposited conductive layer(s) to form the conductive pattern of landing pads 13, 14 and patterned trace lines 15. Though not shown, it will be appreciated that the patterning and etching of the deposited conductive layer(s) may also form metallized sidewall plating layers (not shown) which extend down interior sidewalls of the waveguide openings or apertures 12A-C. As will be appreciated, the conductive landing pads 13, 14 and patterned trace lines 15 may be formed from any reflowable conductive material, including but not limited to a conductive metal (e.g., copper) or metal alloy, conductive or conductor-filled elastomer, or any other conductive material used for electrical connections known to those skilled in the art.

Figure 2B:
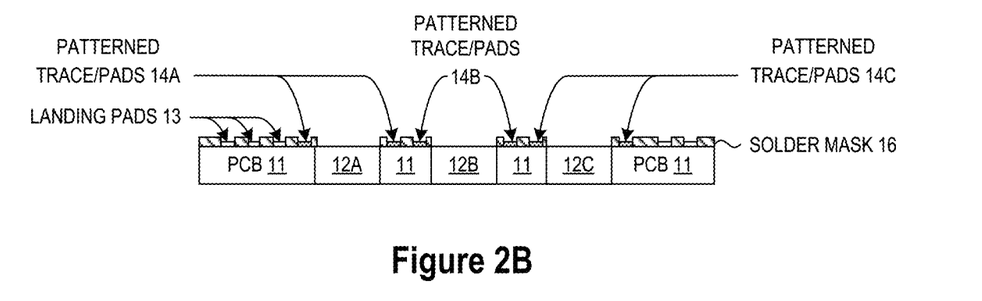

Turning now to FIG. 2B, there is depicted a cross-sectional side view of the PCB substrate 11 with a patterned solder mask 16 at a stage of a package fabrication process after FIG. 2A. While any suitable fabrication process may be used, the patterned solder mask 16 may be formed by applying a solder masking layer to cover the first surface of the PCB substrate 11, and then using photolithography processes to selectively expose and develop the solder masking layer so that solder mask openings are formed to expose the conductive pattern of landing pads 13, 14 and patterned trace lines 15.

Figure 2C:
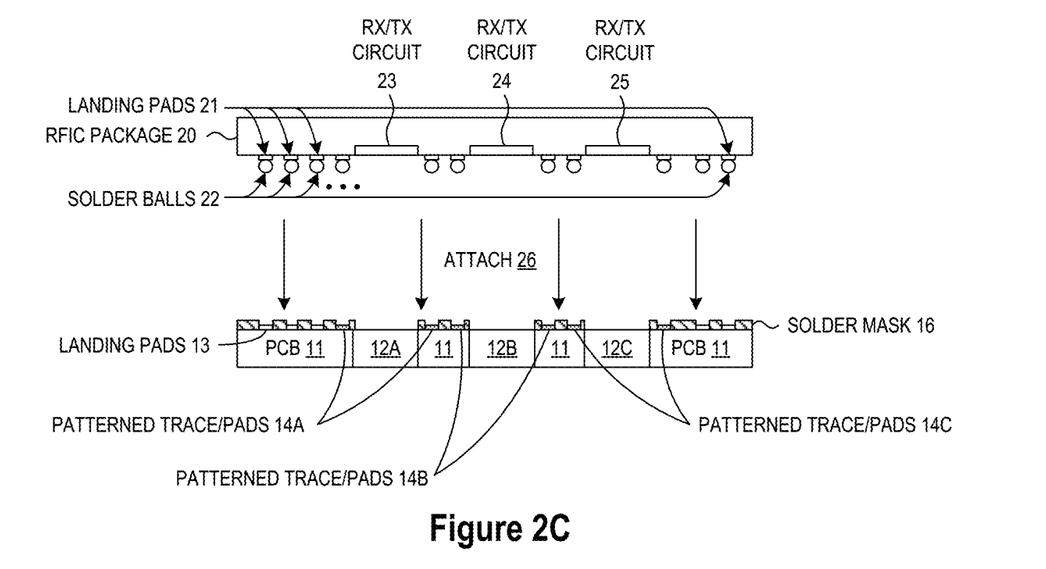

Turning now to FIG. 2C, there is depicted a cross-sectional side view of a ball grid array package 20 which is aligned for attachment 26 to the PCB substrate 11 at a stage of a package fabrication process after FIG. 2B. As depicted, the ball grid array package 20 may be a radio frequency integrated circuit (RFIC) package which includes integrated receive RX and/or transmit TX circuits 23-25, and which includes other circuits which are connected through conductive traces (not shown) to the landing pads 21 and BGA solder ball conductors 22. To affix the solder ball conductors 22, the ball grid array package 20 may include a solder mask layer (not shown) that is affixed to bottom of the package and that has a plurality of solder ball openings in which the solder ball conductors 22 are affixed in electrical contact with an associated landing pad 21. As formed, the RX and/or transmit TX circuits 23-25 are aligned with the waveguide apertures or openings 12A-C to transmit and/or receive RF signals through the PCB substrate 11. In addition, the solder ball conductors 22 are aligned with the openings in the patterned solder mask 16 to make electrical contact with the conductive pattern of landing pads 13, 14.

Figure 2D:
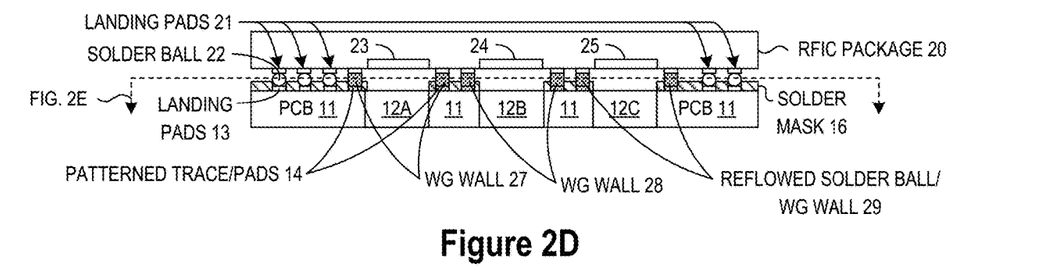

Turning now to FIG. 2D, there is depicted a cross-sectional side view of the ball grid array package 20 mounted to the PCB substrate 11 after a heat reflow process has been applied at a stage of a package fabrication process after FIG. 2C. At the depicted fabrication stage, the heat reflow process joins selected solder balls 22 that are positioned adjacent to the waveguide apertures or openings 12A-C, thereby forming the waveguide shielding walls 27-29 as a closed solder wall between the PCB substrate 11 and RFIC package 20. As will be appreciated, the heat reflow process will reflow all of the solder balls 22, but the solder balls 22 attached to the landing pads 13 are depicted with "round" shapes to indicate that they have not joined with other solder balls, while the "square" shape of the solder balls 27-29 attached to the landing pads 14 indicate that they have been reflowed and joined with other solder balls to form the waveguide shielding walls 27-29. As disclosed herein, the thermal heat treatment step is applied with a controlled duration and temperature to maintain separation of the individual solder balls formed on the landing pads 13, and to allow the individual solder balls 22 formed on the landing pads 14 to reflow and join together to form the waveguide shielding walls 27-29. As disclosed herein, the reflow process is promoted by choosing the correct time and temperature for the thermal heat treatment. In addition, the reflow process is promoted by virtue of the exposed conductive trace lines 15 which are positioned to connect the landing pads 14 for the reflow solder balls 22. In addition, the reflow process is promoted by virtue of the patterned solder mask 16 having no solder mask covering an exposed conductive trace line 15 between the reflow solder balls 22. In addition, the reflow process may be promoted by using a stencil during application of the solder paste which is adapted to print additional solder paste on the conductive trace lines 15 to facilitate the joining of the solder balls on the solder lands 14 and the exposed trace lines 15 connecting them.

Figure 2E:
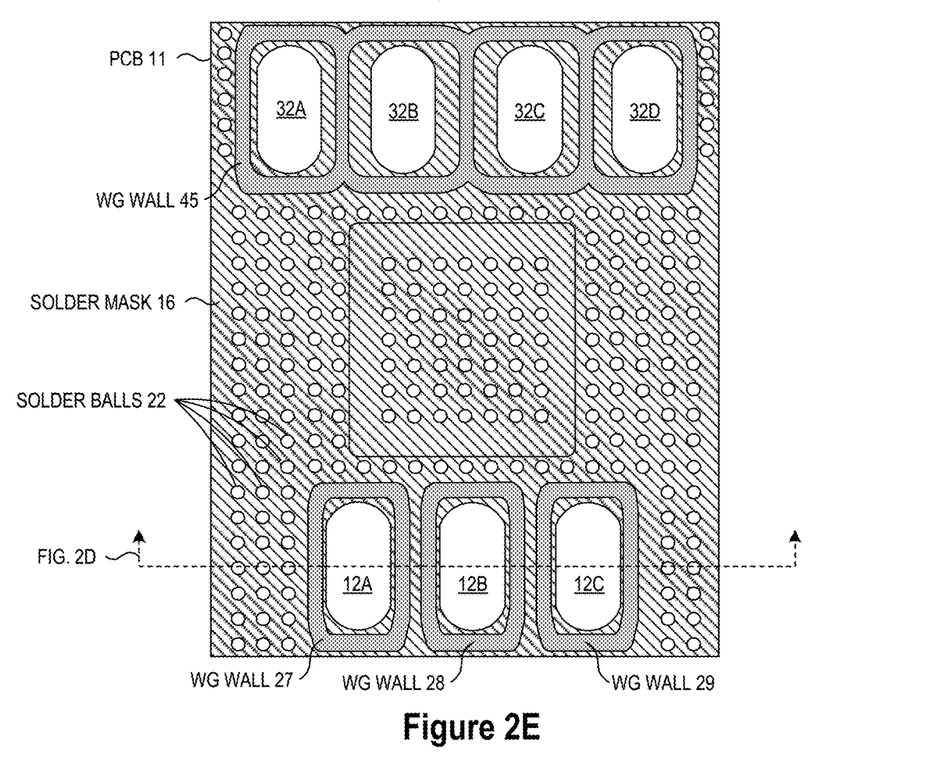

Turning now to FIG. 2E, there is depicted a plan view (through line FIG. 2E shown in FIG. 2D) of the mounted ball grid array package 20 and the PCB substrate 11 to illustrate how the reflowed solder balls 22 formed on the landing pads 14 join together in the defined openings of the solder mask 16 to form the waveguide shielding walls 27-29 around the waveguide apertures or openings 12A-C. By joining the solder balls 22 together with a thermal reflow process to form the closed solder waveguide walls 27-29 between PCB substrate 11 and RFIC package 20, signal leakage between channels formed with the adjacent receive RX and/or transmit TX circuits 23-25 is prevented by the shielding function provided by the fully closed waveguide walls 27-29, thereby improving signal efficiency and channel isolation.

Figure 2F:
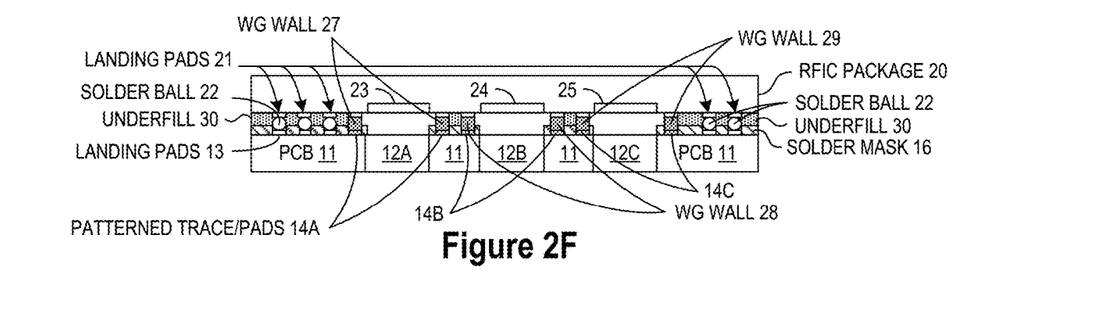

Turning now to FIG. 2F, there is depicted a cross-sectional side view of the mounted ball grid array package 20 and the PCB substrate 11 after forming an underfill layer 30 has been formed at a stage of a package fabrication process after FIG. 2D. As will be appreciated, the underfill layer 30 may be injected between the PCB substrate 11 and the ball grid array package 20 from one or more external injection sites to help bond the ball grid array package 20 to the PCB substrate 11 and to reinforce the solder bumps, thereby improving the reliability of the packaged assembly. In selected embodiments, a liquid underfill dispense technique may be used to apply the underfill at the edges of the ball grid array package 20 and the PCB substrate 11, and capillary action wicks the fluid into the interior regions. During this process, the entire die surface is coated with the underfill except for the areas surrounded and protected by the closed solder waveguide walls 27-29. As a result, the solder waveguide walls 27-29 prevent underfill material 30 from polluting the waveguide transition area between the ball grid array package 20 and the PCB substrate 11, but still allow the device reliability to be improved by forming the underfill layer 30 in other areas of the package assembly, including any openings or spaces between the solder waveguide walls 27-29. In addition to improving device reliability, the use of underfill layer 30 and/or edge bonding will allow a heatsink to be mounted to the package without creating excessive stress on the solder joint and/or the potential creep of the solder joints under pressure. In particular, higher forces can be used in cases where the underfill layer 30 is formed. However, it will be appreciated that, even without an underfill layer 30, a heatsink can be contacted to the package.

Figure 3A:
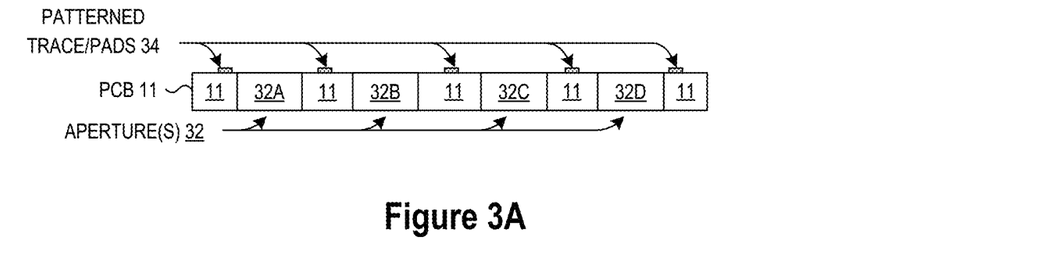
FIGS. 3A-F depict cross-sectional and plan views of a sequence of fabrication steps for attaching the PCB substrate to an integrated circuit package with a ball grid array before reflowing the ball grid array to form a shared waveguide shielding wall around a plurality of waveguide apertures in accordance with selected second embodiments of the present disclosure

As disclosed herein, the specific structure and arrangement of the solder waveguide walls can be adjusted by controlling the placement of the shield wall landing pads and trace lines. For example, reference is now made to FIG. 3A which shows a cross-sectional view (through line FIG. 3A of FIG. 1) of the PCB substrate 11 at a first stage of a package fabrication process in accordance with selected second embodiments of the present disclosure. As depicted in FIGS. 1 and 3A, the PCB substrate 11 includes a plurality of waveguide openings or apertures 32A-D which define a second set of RF waveguides in the PCB substrate 11 for alignment with RF circuits formed in integrated circuit packages that are subsequently mounted or attached to the PCB substrate 11. On the first or top surface of the PCB substrate 11, a conductive pattern of landing pads 33, 34 and patterned trace lines 35 are formed for electrically and physically connecting to the (subsequently formed) solder balls of a (subsequently attached) integrated circuit package. For example, a first set of contact pads or layers 33 may be formed on the top surface of the PCB substrate 11 and electrically connected to one or more conductive vias (not shown) formed in the PCB substrate 11 using any suitable fabrication sequence. In the same fabrication sequence, a second set of patterned contact pads 34 and trace lines 35 are formed on the top surface of the PCB substrate 11 and positioned peripherally to the waveguide apertures or openings 32A-D. For example, one or more conductive layers may be deposited on the PCB substrate 11, and then patterned and etched using photolithography processes to selectively etch the deposited conductive layer(s) to form the conductive pattern of landing pads 33, 34 and patterned trace lines 35. Though not shown, it will be appreciated that the patterning and etching of the deposited conductive layer(s) may also form metallized sidewall plating layers (not shown) which extend down interior sidewalls of the waveguide openings or apertures 32A-D. Again, the conductive landing pads 33, 34 and patterned trace lines 35 may be formed from any conductive material used for electrical connections known to those skilled in the art.

Figure 3B:
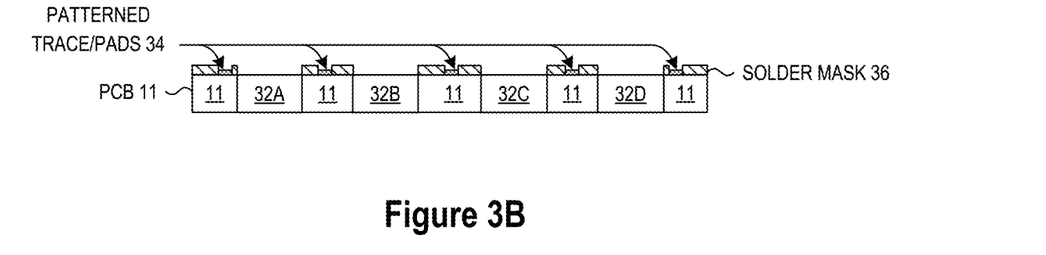

Turning now to FIG. 3B, there is depicted a cross-sectional side view of the PCB substrate 11 with a patterned solder mask 36 at a stage of a package fabrication process after FIG. 3A. As depicted, the patterned solder mask 36 may be formed using any suitable fabrication process to cover the first surface of the PCB substrate 11 with a solder mask layer which is then photolithographically processed to selectively expose and develop the solder masking layer to form solder mask openings that expose the conductive pattern of landing pads 33, 34 and patterned trace lines 35.

Figure 3C:
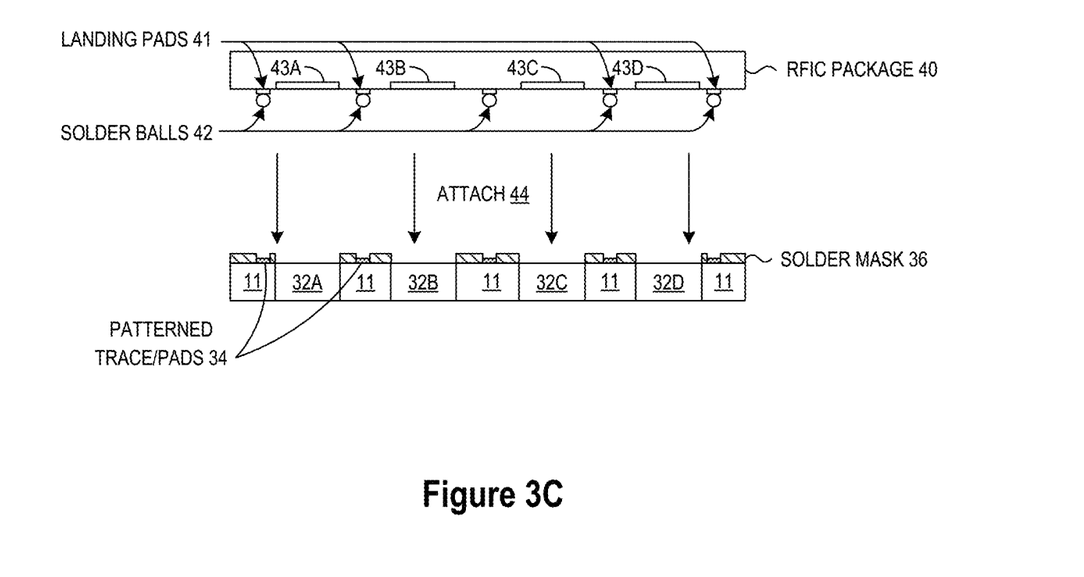

Turning now to FIG. 3C, there is depicted a cross-sectional side view of a ball grid array package 40 which is aligned for attachment 44 to the PCB substrate 11 at a stage of a package fabrication process after FIG. 3B. As depicted, the ball grid array package 40 may be a radio frequency integrated circuit (RFIC) package which includes integrated receive RX and/or transmit TX circuits 43A-D which are connected through conductive traces (not shown) to the landing pads 41 and affixed BGA solder ball conductors 42. As formed, the RX and/or transmit TX circuits 43A-D are aligned with the waveguide apertures or openings 32A-D to transmit and/or receive RF signals through the PCB substrate 11. In addition, the solder ball conductors 42 are aligned with the openings in the patterned solder mask 36 to make electrical contact with the conductive pattern of landing pads 33, 34.

Figure 3D:
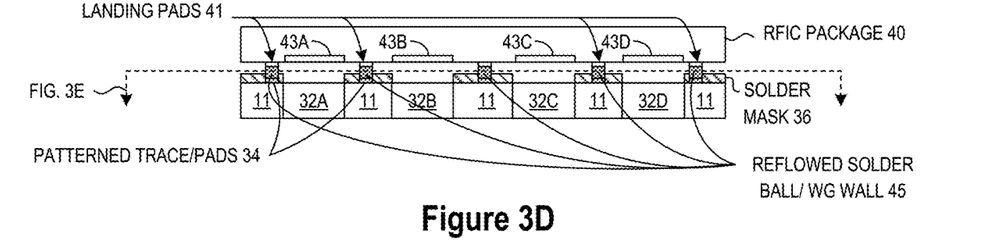

Turning now to FIG. 3D, there is depicted a cross-sectional side view of the ball grid array package 40 mounted to the PCB substrate 11 after a heat reflow process has been applied at a stage of a package fabrication process after FIG. 3C. At the depicted fabrication stage, the heat reflow process joins selected solder balls 42 that are positioned adjacent to the waveguide apertures or openings 32A-D, thereby forming the waveguide shielding walls 45 as a single, continuous, closed solder wall between the PCB substrate 11 and RFIC package 40. As will be appreciated, the heat reflow process will reflow all of the solder balls 42, but the solder balls 42 attached to the landing pads 34 are depicted with "square" shapes to indicate that they have been reflowed and joined with other solder balls to form the waveguide shielding walls 45. As disclosed herein, the thermal heat treatment step is applied with a controlled duration and temperature to maintain separation of the individual solder balls formed on the landing pads 33, and to allow the individual solder balls 42 formed on the landing pads 34 to reflow and join together to form the waveguide shielding walls 45. In addition to controlling the time and temperature for the thermal heat treatment, the reflow process is promoted by virtue of the exposed conductive trace lines 35 which are not covered by the solder mask 45 and which are positioned to connect the landing pads 34 for the reflow solder balls 42. In addition, the reflow process may be promoted by using a stencil during application of the solder paste which is adapted to print additional solder paste on the conductive trace lines 35 to facilitate the joining of the solder balls on the solder lands 34 and the exposed trace lines 35 connecting them.

Figure 3E:
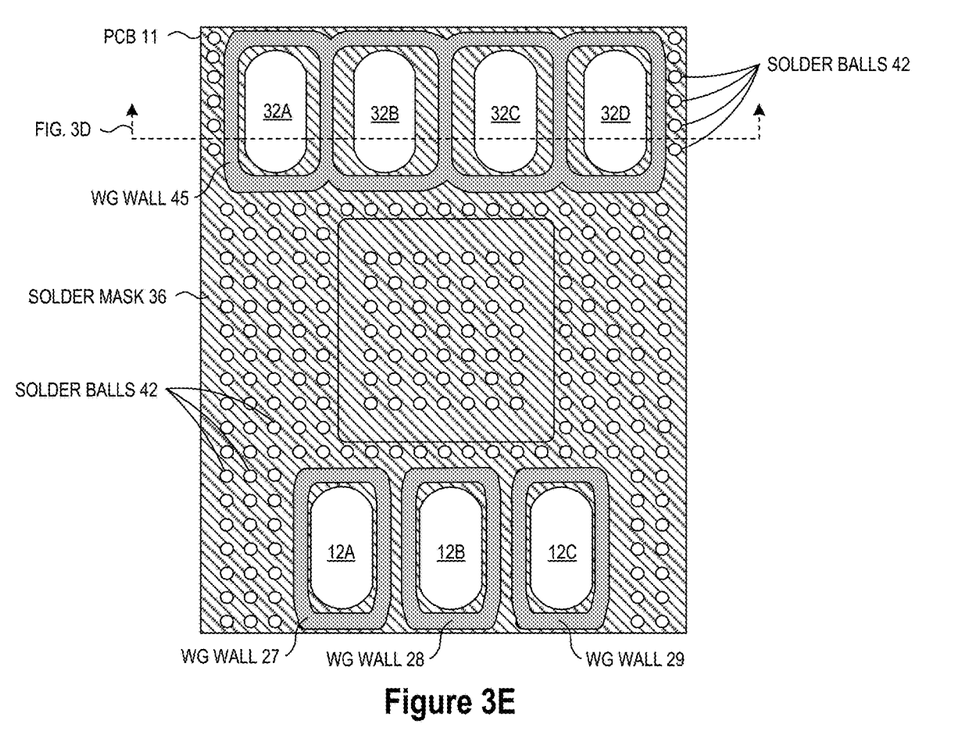

Turning now to FIG. 3E, there is depicted a plan view (through line FIG. 3E shown in FIG. 3D) of the mounted ball grid array package 40 and the PCB substrate 11 to illustrate how the reflowed solder balls 42 formed on the landing pads 34 join together in the defined openings of the solder mask 36 to form the waveguide shielding walls 45 around the waveguide apertures or openings 32A-D. By joining the solder balls 42 together with a thermal reflow process to form the closed solder waveguide walls 45 between PCB substrate 11 and RFIC package 40, signal leakage between channels formed with the adjacent receive RX and/or transmit TX circuits 43A-D is prevented by the shielding function provided by the fully closed waveguide walls 45, thereby improving signal efficiency and channel isolation. In addition, by forming the closed solder waveguide walls 45 with only a single row of solder balls 42 positioned between adjacent waveguide openings, a more compact arrangement of RF waveguides may be formed with protective shielding.

Figure 3F:
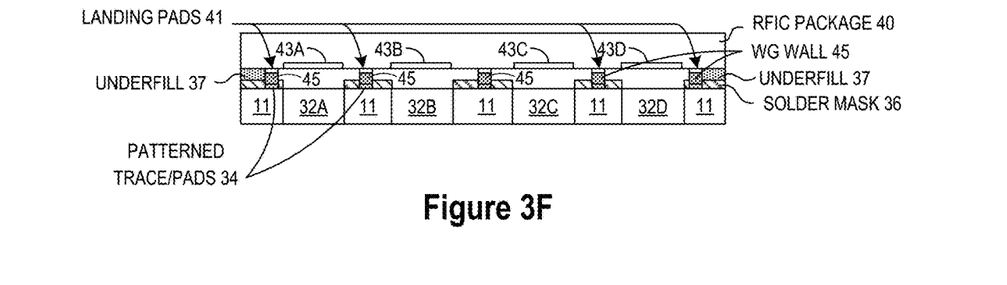

Turning now to FIG. 3F, there is depicted a cross-sectional side view of the mounted ball grid array package 40 and the PCB substrate 11 after forming an underfill layer 37 at a stage of a package fabrication process after FIG. 3D. As will be appreciated, the underfill layer 37 may be injected between the PCB substrate 11 and the ball grid array package 40 from one or more external injection sites to help bond the ball grid array package 40 to the PCB substrate 11 and to reinforce the solder bumps, thereby improving the reliability of the packaged assembly while also preventing underfill material 37 from polluting the waveguide transition area between the ball grid array package 40 and the PCB substrate 11. In addition to improving device reliability, the use of underfill layer 37 and/or edge bonding will allow a heatsink to be mounted to the package without creating excessive stress on the solder joint and/or the potential creep of the solder joints under pressure.

As seen from above, the use of patterned openings in the solder mask (e.g., 36) to position the solder balls (e.g., 42) at the periphery of the waveguide openings (e.g., 32) can result in the waveguide shielding walls (e.g., 45) being laterally displaced or non-aligned with the waveguide aperture sidewalls. Such discontinuities in the RF waveguide sidewalls can interfere with RF signal transmission or reception. To reduce the signal disruptions from such RF waveguide sidewall discontinuities, the specific structure and arrangement of the solder waveguide walls can be adjusted by controlling the placement of the reflow solder balls, landing pads, and trace lines so that the waveguide shielding walls are aligned with the waveguide openings. For example, reference is now made to FIG. 4A which shows a cross-sectional view of a PCB substrate 51 at a first stage of a package fabrication process in accordance with selected third embodiments of the present disclosure. As depicted, the PCB substrate 51 includes a plurality of waveguide openings or apertures 52A-C which define a set of RF waveguides in the PCB substrate 51 for alignment with RF circuits formed in integrated circuit packages that are subsequently mounted or attached to the PCB substrate 51. On the PCB substrate 51, a conductive pattern of landing pads 53 and trace lines 54 are formed for electrically and physically connecting to the (subsequently formed) solder balls of a (subsequently attached) integrated circuit package. In particular, a first set of contact pads or layers 53 may be formed on the top surface of the PCB substrate 51 and electrically connected to one or more conductive vias (not shown) formed in the PCB substrate 51 using any suitable fabrication sequence. In the same fabrication sequence, a second set of patterned contact pads and trace lines 54 are formed on the top and bottom surfaces of the PCB substrate 51 and on the sidewalls of the waveguide openings 52A-C to cover the peripheral edges of the waveguide openings 52A-C. For example, one or more conductive layers may be deposited (e.g., electroplated) on the PCB substrate 51, and then patterned and etched using photolithography processes to selectively etch the deposited conductive layer(s) to form the conductive pattern of landing pads 53 and the sidewall plating layer of the patterned trace lines/pads 54. Again, the conductive landing pads 53 and patterned trace lines/pads 54 may be formed from any conductive material used for electrical connections known to those skilled in the art.

Figure 4A:
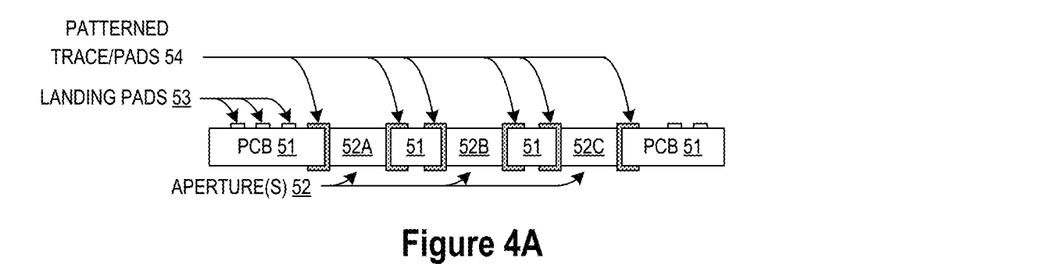
FIGS. 4A-E depict cross-sectional views of a sequence of fabrication steps for attaching the PCB substrate to an integrated circuit package with a ball grid array before reflowing the ball grid array to form waveguide shielding walls in alignment with waveguide aperture sidewalls in accordance with selected third embodiments of the present disclosure.
Figure 4B:
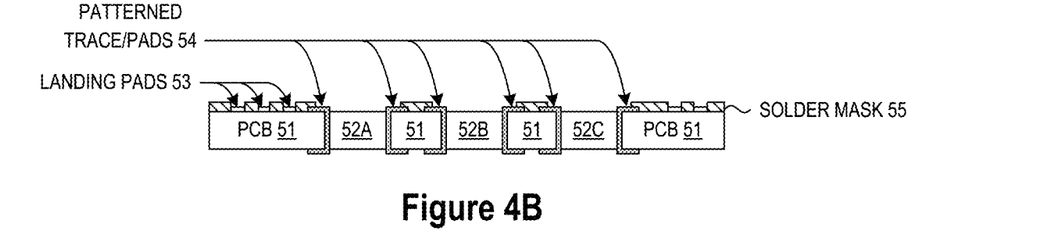

Turning now to FIG. 4B, there is depicted a cross-sectional side view of the PCB substrate 51 with a patterned solder mask 55 at a stage of a package fabrication process after FIG. 4A. As depicted, the patterned solder mask 55 may be formed using any suitable fabrication process to cover the first surface of the PCB substrate 51 with a solder mask layer which is then photolithographically processed to selectively expose and develop the solder masking layer to form solder mask openings that expose the conductive landing pads 53 and patterned trace lines/pads 54.

Figure 4C:
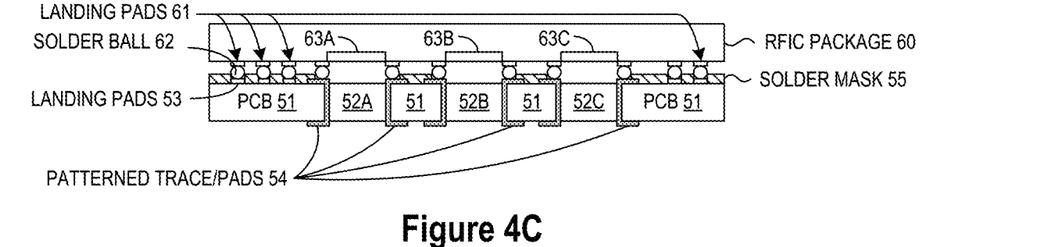

Turning now to FIG. 4C, there is depicted a cross-sectional side view of a ball grid array package 60 which is mounted on the PCB substrate 51 at a stage of a package fabrication process after FIG. 4B. As depicted, the ball grid array package 60 may be an RFIC package which includes integrated receive RX and/or transmit TX circuits 63A-C which are connected through conductive traces (not shown) to the landing pads 61 and affixed BGA solder ball conductors 62. As formed, the RX and/or transmit TX circuits 63A-C are aligned with the waveguide apertures or openings 52A-C to transmit and/or receive RF signals through the PCB substrate 51. In addition, the solder ball conductors 62 are aligned with the openings in the patterned solder mask 55 to make electrical contact with the conductive landing pads 53 and patterned trace lines/pads 54. In this way, the solder ball conductors 62 nearest the waveguide openings 52A-C may be placed in close proximity to the waveguide opening sidewalls.

Figure 4D:
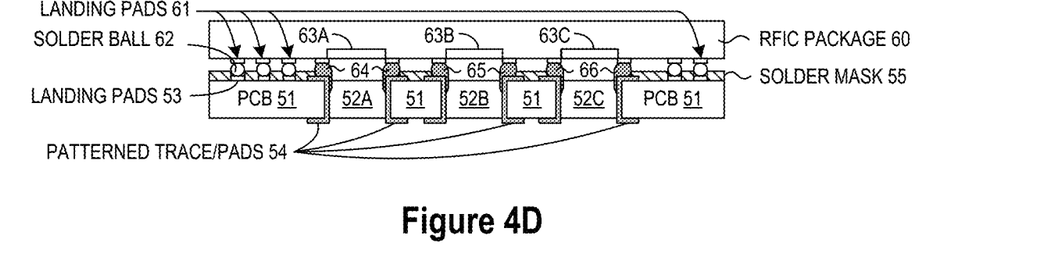

Turning now to FIG. 4D, there is depicted a cross-sectional side view of the ball grid array package 60 mounted to the PCB substrate 51 after a heat reflow process has been applied at a stage of a package fabrication process after FIG. 4C. At the depicted fabrication stage, the heat reflow process joins selected solder balls 62 that are positioned adjacent to the waveguide apertures or openings 52A-C, thereby forming separate waveguide shielding walls 64, 65, 66 which each form a closed solder wall between the PCB substrate 51 and RFIC package 60. As will be appreciated, the heat reflow process will reflow all of the solder balls 62, but the solder balls 62 attached to the landing pads 53 are depicted with "round" shapes to indicate that they have not joined with other solder balls, while the "square" shape of the solder balls 64-66 attached to the landing pads 54 indicate that they have been reflowed and joined with other solder balls to form the waveguide shielding walls 64-65. As disclosed herein, the thermal heat treatment step is applied with a controlled duration and temperature to maintain separation of the individual solder balls 62 formed on the landing pads 53, and to allow the individual solder balls 62 formed on the patterned trace lines/pads 54 to reflow and join together to form the waveguide shielding walls 64-66. In addition to controlling the time and temperature for the thermal heat treatment, the reflow process is promoted by virtue of the exposed conductive trace lines 54 which are not covered by the solder mask 55 and which are positioned to connect the landing pads 54 for the reflow solder balls 62. In addition, the reflow process may be promoted by using a stencil during application of the solder paste which is adapted to print additional solder paste on the conductive trace lines 54 to facilitate the joining of the reflow solder balls on the patterned trace lines/pads 54. As depicted, the heat reflow process causes the reflow solder balls 62 and any solder paste to reflow at least partially down the sidewall plating layer of the patterned trace lines/pads 54, thereby aligning the waveguide shielding walls 64-66 more closely with the waveguide aperture sidewalls.

Figure 4E:
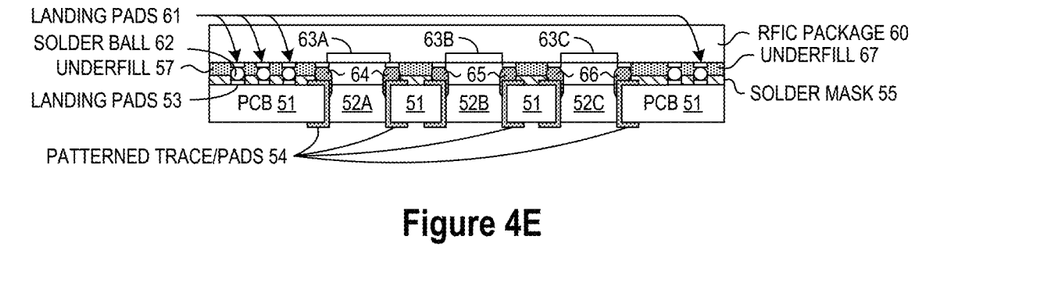

Turning now to FIG. 4E, there is depicted a cross-sectional side view of the mounted ball grid array package 60 and the PCB substrate 51 after forming an underfill layer 67 at a stage of a package fabrication process after FIG. 4D. As will be appreciated, the underfill layer 67 may be injected between the PCB substrate 51 and the ball grid array package 60 from one or more external injection sites to help bond the ball grid array package 60 to the PCB substrate 51 and to reinforce the solder bumps, thereby improving the reliability of the packaged assembly while also preventing underfill material 67 from polluting the waveguide transition area between the ball grid array package 60 and the PCB substrate 51. In addition to improving device reliability, the use of underfill layer 67 and/or edge bonding will allow a heatsink to be mounted to the package without creating excessive stress on the solder joint and/or the potential creep of the solder joints under pressure.

As disclosed herein, the efficient formation of a waveguide shielding walls around the RF waveguides from solder balls is facilitated by using a conductive metal (e.g., copper) to connect conductive landing pads with conductive trace lines which provide a wettable surface which enables the solder balls and any solder paste to reflow into a single closed solder wall between PCB substrate and integrated circuit package which reduces leakage between adjacent transmit or receive channels. In effect, the conductive trace lines form a solder bridge over which the reflow solder balls (and any solder paste) flow together. As will be appreciated, the specific shape and path defined by the conductive trace lines can be controlled to provide specific benefits in terms of device cost and performance.

Figure 5A:
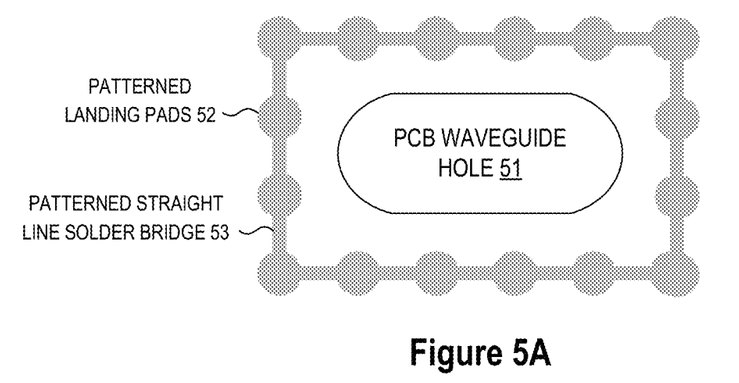
FIG. 5A illustrates a plan view of a first patterned conducive landing pad and shield wall trace in accordance with selected embodiments of the present disclosure.

To illustrate a first example conductive trace line shape and path, reference is now made to FIG. 5A which illustrates a plan view of a first patterned conductive layer 52-53 formed on a first surface of a PCB substrate to surround the periphery of a PCB waveguide hole 51 in accordance with selected embodiments of the present disclosure. As depicted, the first patterned conductive layer includes defined landing pads 52 which are connected with straight line solder bridge trace elements 53. As will be appreciated, the first patterned conductive layer 52-53 may be formed with any suitable fabrication process, such as by depositing or electroplating one or more conductive layers (e.g., copper) on the PCB substrate, and then patterning and selectively etching the deposited conductive layer(s) using photolithography processes to form the first patterned conductive layer 52-53 as a single continuous patterned layer. By using thin, straight trace lines, the first patterned conductive layer 52-53 reduces the volume of solder required to form the waveguide shielding walls, and may also enable the solder balls to reflow into contact with one another more readily.

Figure 5B:
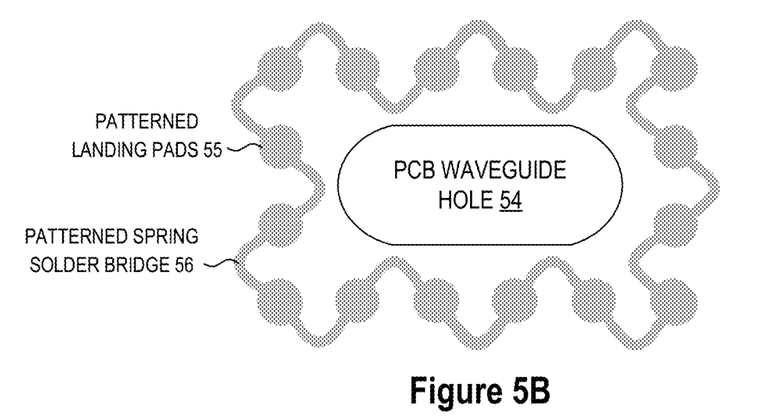
FIG. 5B illustrates a plan view of a second patterned conducive landing pad and shield wall trace in accordance with selected embodiments of the present disclosure.

To illustrate a second conductive trace line shape and path, reference is now made to FIG. 5B which illustrates a plan view of a second patterned conductive layer 55-56 formed on a first surface of a PCB substrate to surround the periphery of a PCB waveguide hole 54 in accordance with selected embodiments of the present disclosure. As depicted, the second patterned conductive layer includes defined landing pads 55 which are connected with curved solder bridge trace elements 56. Again, the second patterned conductive layer 55-56 may be formed with any suitable fabrication process to form a single continuous patterned layer. By using alternating curved trace lines 56, the second patterned conductive layer 55-56 forms a "spring" which reduces stresses on the solder that can arise from in-plane thermal expansion of the PCB substrate while still enabling the solder balls to reflow into contact with one another.

Figure 5C:
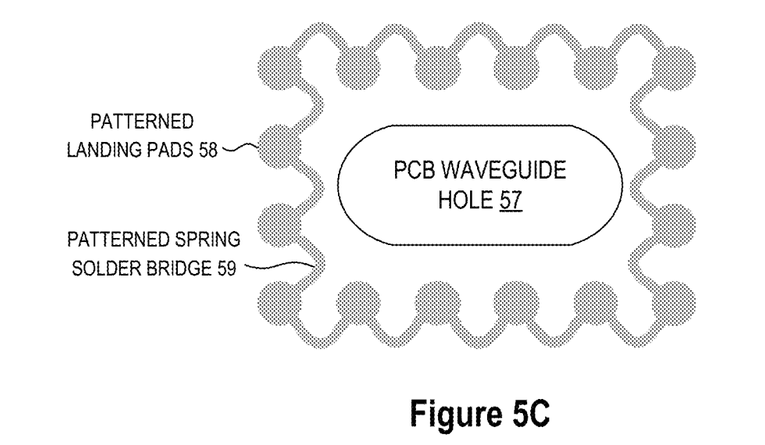
FIG. 5C illustrates a plan view of a third patterned conducive landing pad and shield wall trace in accordance with selected embodiments of the present disclosure.

To illustrate a third conductive trace line shape and path, reference is now made to FIG. 5C which illustrates a plan view of a second patterned conductive layer 58-59 formed on a first surface of a PCB substrate to surround the periphery of a PCB waveguide hole 57 in accordance with selected embodiments of the present disclosure. As depicted, the third patterned conductive layer includes defined landing pads 58 which are connected with curved solder bridge trace elements 59 which curve inward (on the left and right bridges) and which curve outward (on the top and bottom bridges) to the PCB waveguide hole 57. In other embodiments, all of the curved solder bridge trace elements may curve inward toward the PCB waveguide hole 57, or alternatively outward from the PCB waveguide hole 57. Again, the third patterned conductive layer 58-59 may be formed with any suitable fabrication process to form a single continuous patterned layer. By using the curved trace lines 59 which all curve inward toward the PCB waveguide hole 57, the third patterned conductive layer 58-59 forms a "spring" which reduces stresses on the solder while still enabling the solder balls to reflow into contact with one another to form the waveguide shielding walls in close proximity to the sidewalls of the PCB waveguide hole 57.

Figure 6:
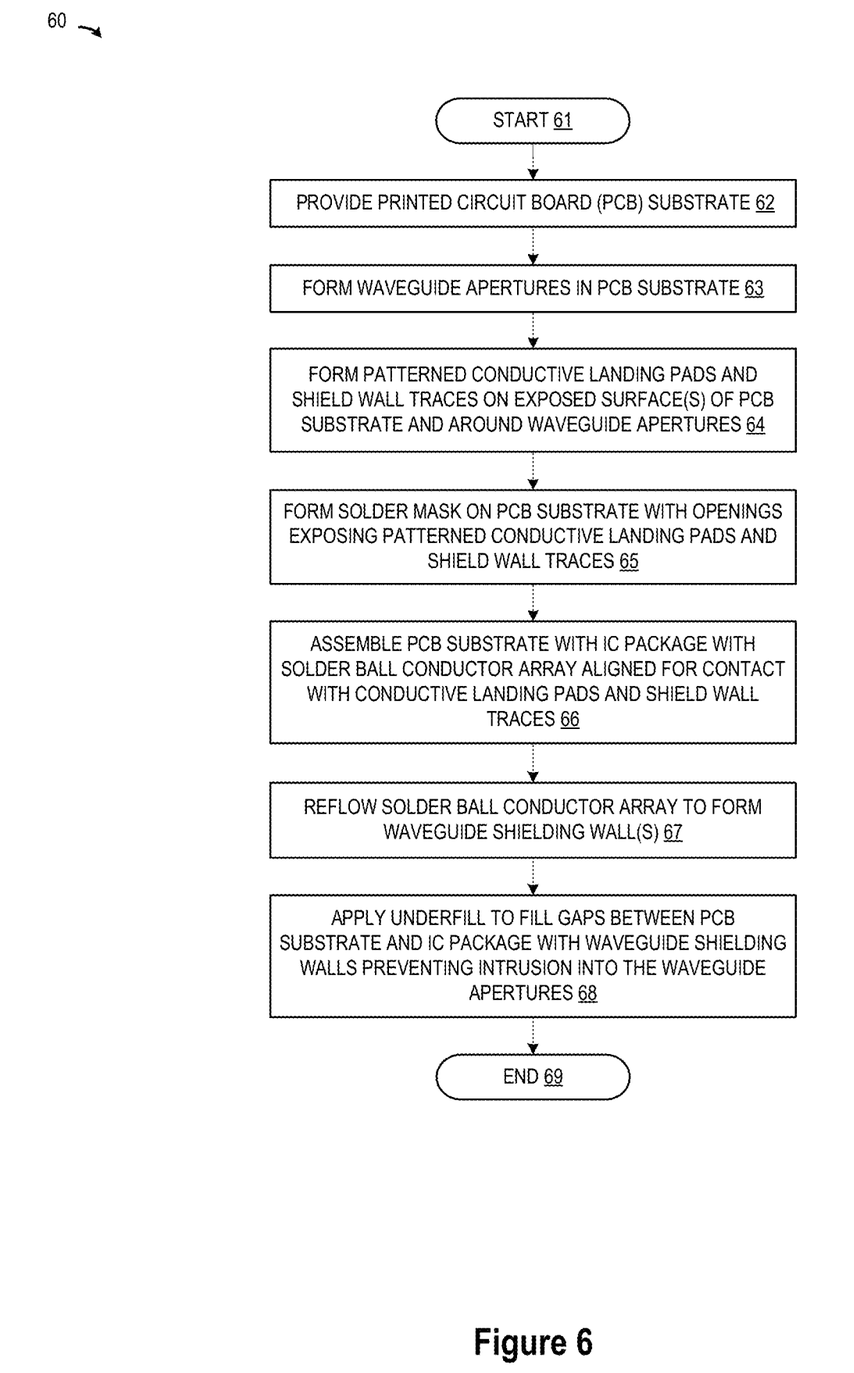
FIG. 6 is a simplified process flow chart showing sequence of fabrication steps for fabricating waveguide shielding walls in accordance with selected embodiments of the present disclosure.

To further illustrate selected embodiments of the present invention, reference is now made to FIG. 6 which is a simplified process flow chart 60 illustrating an example method for fabricating waveguide shielding walls at a waveguide interface of an integrated circuit package assembly. In describing the fabrication methodology, the description is intended merely to facilitate understanding of various exemplary embodiments and not by way of limitation. Unless otherwise indicated, the steps may be provided in any desired order. Since the steps illustrated in FIG. 6 and described below are provided by way of example only, it will be appreciated that the sequence of illustrated steps may be modified, reduced or augmented in keeping with the alternative embodiments of the disclosure so that the method may include additional steps, omit certain steps, substitute or alter certain steps, or perform certain steps in an order different than that illustrated in FIG. 6. Thus, it will be appreciated that the methodology of the present invention may be thought of as performing the identified sequence of steps in the order depicted, though the steps may also be performed in parallel, in a different order, or as independent operations that are combined.

Once the methodology starts (step 61), a printed circuit board (PCB) substrate is provided at step 62. In selected embodiments, the PCB substrate mat be an epoxy-based substrate, such as FR-4 epoxy for example, but any suitable mounting substrate element may be used.

At step 63, one or more waveguide apertures are formed in the PCB substrate. In selected embodiments, a masked etching process may be used to form the waveguide apertures as through holes in the PCB substrate. Alternatively, the PCB substrate may be formed as a molded structure in which waveguide apertures are formed as integral openings extending between opposed surfaces of the PCB substrate. In other embodiments, the waveguide apertures may be formed by mechanical techniques (e.g., drilling) and/or chemical techniques (e.g., etching). Each waveguide aperture extends through the PCB substrate along an aperture axis so as to define inwardly-facing sidewalls in the PCB substrate.

At step 64, one or more conductive layers are patterned on at least a first surface of the PCB substrate. The conductive layer(s) are suitable for carrying electrical signals thereon, and may include a metallic material, such as copper, gold, aluminum of the like. In selected embodiments, each conductive layer is formed by bonding, sputtering depositing, or electroplating a layer of copper over the entire PCB substrate, sometimes on both sides. Subsequently, any suitable photolithographic process may be applied to pattern and selectively etch the conductive layer(s), thereby forming a conductive pattern of landing pads and trace lines. In other embodiments, the conductive pattern of landing pads and trace lines can be made by adding traces to the bare PCB substrate (or a substrate with a very thin layer of copper) usually by a process of multiple electroplating steps. As a result, each waveguide aperture is surrounded at its periphery by a patterned conductive layer which includes defined landing pads which are connected with solder bridge trace elements, as described hereinabove.

At step 65, a patterned solder mask is formed on the PCB substrate with openings which expose the patterned conductive landing pads and shield wall traces on the PCB substrate. In selected embodiments, the patterned solder mask is formed by applying a solder masking layer to cover at least the first surface of the PCB substrate, and then any suitable photolithographic process may be applied to selectively expose and develop the solder masking layer so that solder mask openings are formed to expose the conductive pattern of landing pads and trace lines.

At step 66, the PCB substrate is assembled with an integrated circuit package having a solder ball conductor array aligned for contact with the conductive pattern of landing pads and trace lines formed on the PCB substrate. Typically, the IC package includes an antenna that is positioned in alignment with a waveguide aperture. In selected embodiments, the PCB substrate is affixed to the IC package by using any suitable adhesive mechanism, such as adhering the solder ball conductor array to the conductive landing pads on the PCB substrate. As part of the assembly step, a stencil may be used to apply solder paste on the conductive pattern of the trace lines. In addition, the assembly step results in the attachment of solder ball conductors to the conductive pattern of landing pads surrounding the periphery of each waveguide aperture.

At step 67, a heat reflow process is applied to the solder ball conductor array to form a waveguide shielding wall around each waveguide aperture. In selected embodiments, the heat reflow is a thermal processing step having a controlled duration and temperature which allows individual solder ball conductors formed on the conductive pattern of landing pads to reflow and join together over the trace lines when forming the waveguide shielding walls. As a result of the heat reflow process, the reflow solder balls (and any solder paste applied to the trace lines) reflow to form a fully closed solder waveguide walls which shield the RF waveguide apertures in the PCB substrate from leakage and/or external interference.

At step 68, an underfill material or layer is applied to fill the gaps between the conductive solder balls attaching the PCB substrate and IC package. While any suitable underfill application process may be used, the underfill layer may be injected between the PCB substrate and the IC package from one or more external injection sites to help bond the IC package to the PCB substrate and to reinforce the solder bumps, thereby improving the reliability of the packaged assembly. However, the fully closed solder waveguide walls prevent underfill material from intruding into the waveguide apertures.

After completion of the package processing steps, the fabrication method ends at step 69.

By now it should be appreciated that there has been provided a package assembly and associated method for making the package assembly from a PCB substrate and integrated circuit package. In the disclosed methodology, the PCB substrate is provided with at least a first waveguide aperture and a conductive pattern disposed on a first surface of the PCB substrate, where the conductive pattern includes a plurality of landing pads disposed around peripheral edges of the first waveguide aperture and connected to one another by trace lines. The disclosed methodology also includes forming a patterned solder mask layer over the first surface of the PCB substrate, where the patterned solder mask layer includes a plurality of mask openings corresponding in location to the plurality of landing pads and the trace lines. In selected embodiments, the landing pads in the conductive pattern are connected by straight trace lines to form solder bridges between the plurality of landing pads disposed around peripheral edges of the first waveguide aperture. In other embodiments, the landing pads in the conductive pattern are connected by curved trace lines to form solder bridge springs between the plurality of landing pads disposed around peripheral edges of the first waveguide aperture. In other embodiments, the landing pads disposed around peripheral edges of the first waveguide aperture include a plurality of patterned sidewall plating layers formed on the first surface and extending down interior sidewalls of the first waveguide aperture. In addition, the disclosed methodology includes attaching a plurality of solder balls to the PCB substrate by affixing a solder ball to each landing pad through a corresponding mask opening so that the first waveguide aperture is surrounded by solder balls having a predetermined minimum spacing distance between adjacent solder balls. In selected embodiments, the solder balls are attached to the PCB substrate by securing the first surface of the PCB substrate to the solder balls which are affixed to an integrated circuit die package which includes an antenna which is aligned to send or receive radio frequency signals through the first waveguide aperture. In other embodiments, the solder balls are attached to the PCB substrate by printing solder paste on the trace lines to facilitate reflow of the plurality of solder balls along the trace lines during heating. The disclosed methodology also includes heating the plurality of solder balls and the PCB substrate to a predefined temperature for a predefined duration to reflow the plurality of solder balls along the trace lines to form a fully closed solder waveguide shielding wall disposed around peripheral edges of the first waveguide aperture. In selected embodiments, the disclosed methodology also includes injecting an underfill adhesive material to surround the plurality of solder balls such that the fully closed solder waveguide shielding wall prevents the underfill adhesive material from intruding into the first waveguide aperture.

In another form, there is provided a packaged semiconductor device and method for fabricating same. As disclosed, the packaged semiconductor device includes a printed circuit board substrate having at least a first waveguide aperture extending between first and second surfaces of the printed circuit board substrate. In selected embodiments, one or more conductive sidewall plating layers are formed on interior sidewalls of the first waveguide aperture. In addition, the packaged semiconductor device includes a patterned conductive layer formed on the first surface of the printed circuit board substrate with a conductive material (e.g., copper) to define a first plurality of landing pads connected to one another by trace lines and disposed around peripheral edges of the first waveguide aperture. In selected embodiments, the first plurality of landing pads are connected by straight trace lines to form solder bridges between the first plurality of landing pads disposed around peripheral edges of the first waveguide aperture. In other embodiments, the first plurality of landing pads are connected by curved trace lines to form solder bridge springs between the first plurality of landing pads disposed around peripheral edges of the first waveguide aperture. In selected embodiments, the packaged semiconductor device includes a patterned solder mask layer formed on the first surface of the printed circuit board substrate with a plurality of mask openings corresponding in location to the first plurality of landing pads and the trace lines. The packaged semiconductor device also includes a semiconductor device having a second plurality of landing pads formed on a first surface of the semiconductor device. In selected embodiments, the semiconductor device is a radio frequency integrated circuit with an antenna formed on the first surface of the semiconductor device such that the antenna is aligned to send or receive radio frequency signals through the first waveguide aperture and the waveguide transition structure. In addition, the packaged semiconductor device includes a fully closed solder waveguide shielding wall attaching the patterned conductive layer to the second plurality of landing pads and disposed around peripheral edges of the first waveguide aperture to form a waveguide transition structure between the printed circuit board substrate and the semiconductor device. In selected embodiments, the fully closed solder waveguide shielding wall is formed with a plurality of reflowed solder balls which are attached to the first plurality of landing pads and trace lines to form a closed solder wall between the printed circuit board substrate and the semiconductor device to reduce signal leakage to and from any radio frequency signal transmitted through the first waveguide aperture. In other embodiments, the fully closed solder waveguide shielding wall is formed with a plurality of reflowed solder balls which form a closed solder wall ring having interior sidewalls that are substantially aligned with interior sidewalls of the first waveguide aperture. In selected embodiments, the packaged semiconductor device includes an underfill adhesive material formed between the printed circuit board substrate and the semiconductor device to surround the fully closed solder waveguide shielding wall without intruding into the first waveguide aperture.

In yet another form, there is provided an integrated circuit package assembly and method for fabricating same. As disclosed, the integrated circuit package assembly includes an integrated circuit chip package having a plurality of radio frequency coupling structures disposed on a first surface of the integrated circuit chip. In addition, the integrated circuit package assembly includes a carrier substrate having a plurality of waveguide openings which extend between first and second opposed surfaces of the carrier substrate and which are aligned, respectively, with the plurality of radio frequency coupling structures. The integrated circuit package assembly also includes a plurality of reflow solder waveguide shielding walls attaching the integrated circuit chip package to the carrier substrate, where each reflow solder waveguide shielding wall is disposed around peripheral edges of a corresponding waveguide opening formed in the carrier substrate to at least substantially prevent signal leakage to and from any radio frequency signal transmitted through said corresponding waveguide opening. In selected embodiments, each reflow solder waveguide shielding wall is a fully closed reflow solder waveguide shielding wall that fully surrounds the peripheral edges of the corresponding waveguide opening, or is a reflow solder waveguide shielding wall that includes a discontinuity or gap but still substantially surrounds the peripheral edges of the corresponding waveguide opening. In selected embodiments, the plurality of reflow solder waveguide shielding walls are each connected to a predetermined reference or ground voltage. In selected embodiments, integrated circuit package assembly also includes a patterned conductive layer formed on the first surface of the carrier substrate to define, around peripheral edges of each of the plurality of waveguide openings, a first plurality of copper landing pads connected to one another by copper trace lines.

As disclosed herein, there are numerous advantages and benefits provided by selected embodiments of the present disclosure. For example, connecting a BGA package with mm wave launcher(s) to a PCB substrate using the solder trace and reflow techniques to form solid shielding walls at the waveguide interface will increase isolation between channels and increase signaling efficiency. In addition, the forming of solid shielding walls from reflowed solder balls will also allow the use of underfill layers to enhance reliability of the solder connection and the product lifetime without allowing underfill layer intrusion into the waveguide transition between the BGA package and PCB substrate. Another advantage provided by including the underfill layer is that a heat sink can be mounted on the integrated circuit package without risk of solder ball deformation (creep) at elevated temperatures. Yet another advantage provided by forming solid shielding walls around each aperture is that flux vapors created during soldering can escape via the aperture(s) in the PCB substrate, enabling a full ring or circle to be formed without risk of solder splashes from the wall formed between the different solder balls. These advantages are obtained without requiring any significant changes to the package assembly process flow since the solder ball grid array may be placed with the regular grid spacing. However, it will be appreciated that slight deviations of the solder ball grid array positioning can be used to facilitate board assembly and solder reflow performance, such as by placing the landing pads and solder balls at closer spacing to enable solder reflow and joining of solder balls.

Although the described exemplary embodiments disclosed herein focus on example RF integrated circuit package assemblies that can be used in automotive applications, the present disclosure is not necessarily limited to the example embodiments illustrate herein. For example, various package assembly embodiments may include additional or fewer waveguide apertures formed in a carrier substrate, and may use additional or fewer integrated circuit components than those specifically set forth. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a package assembly, comprising:
providing printed circuit board substrate comprising at least a first waveguide aperture and a conductive pattern disposed on a first surface of the printed circuit board substrate, where the conductive pattern comprises a plurality of landing pads disposed around peripheral edges of the first waveguide aperture and connected to one another by trace lines;
forming, over the first surface of the printed circuit board substrate, a patterned solder mask layer comprising a plurality of mask openings corresponding in location to the plurality of landing pads and the trace lines; and
attaching a plurality of solder balls to the printed circuit board substrate by affixing a solder ball to each landing pad through a corresponding mask opening so that the first waveguide aperture is surrounded by solder balls having a predetermined minimum spacing distance between adjacent solder balls; and
heating the plurality of solder balls and the printed circuit board substrate to a predefined temperature for a predefined duration to reflow the plurality of solder balls along the trace lines to form a fully closed solder waveguide shielding wall disposed around peripheral edges of the first waveguide aperture.

2. The method of claim 1, where the plurality of landing pads in the conductive pattern are connected by straight trace lines to form solder bridges between the plurality of landing pads disposed around peripheral edges of the first waveguide aperture.

3. The method of claim 1, where the plurality of landing pads in the conductive pattern are connected by curved trace lines to form solder bridge springs between the plurality of landing pads disposed around peripheral edges of the first waveguide aperture.

4. The method of claim 1, where the plurality of landing pads disposed around peripheral edges of the first waveguide aperture comprise a plurality of patterned sidewall plating layers formed on the first surface and extending down interior sidewalls of the first waveguide aperture.

5. The method of claim 1, where attaching the plurality of solder balls to the printed circuit board substrate comprises securing the first surface of the printed circuit board substrate to the plurality of solder balls which are affixed to an integrated circuit die package comprising an antenna which is aligned to send or receive radio frequency signals through the first waveguide aperture.

6. The method of claim 1, where attaching the plurality of solder balls to the printed circuit board substrate comprises printing solder paste on the trace lines to facilitate reflow of the plurality of solder balls along the trace lines during heating.

7. The method of claim 1, further comprising injecting an underfill adhesive material to surround the plurality of solder balls such that the fully closed solder waveguide shielding wall prevents the underfill adhesive material from intruding into the first waveguide aperture.

8. A packaged semiconductor device, comprising:
a printed circuit board substrate comprising at least a first waveguide aperture extending between first and second surfaces of the printed circuit board substrate;
a patterned conductive layer formed on the first surface of the printed circuit board substrate to define a first plurality of landing pads connected to one another by trace lines and disposed around peripheral edges of the first waveguide aperture;
a semiconductor device comprising a second plurality of landing pads formed on a first surface of the semiconductor device; and
a fully closed solder waveguide shielding wall attaching the patterned conductive layer to the second plurality of landing pads and disposed around peripheral edges of the first waveguide aperture to form a waveguide transition structure between the printed circuit board substrate and the semiconductor device.

9. The packaged semiconductor device of claim 8, where the semiconductor device comprises a radio frequency integrated circuit with an antenna formed on the first surface of the semiconductor device such that the antenna is aligned to send or receive radio frequency signals through the first waveguide aperture and the waveguide transition structure.

10. The packaged semiconductor device of claim 8, where the first plurality of landing pads are connected by straight trace lines to form solder bridges between the first plurality of landing pads disposed around peripheral edges of the first waveguide aperture.

11. The packaged semiconductor device of claim 8, where the first plurality of landing pads are connected by curved trace lines to form solder bridge springs between the first plurality of landing pads disposed around peripheral edges of the first waveguide aperture.

12. The packaged semiconductor device of claim 8, further comprising one or more conductive sidewall plating layers formed on interior sidewalls of the first waveguide aperture.

13. The packaged semiconductor device of claim 8, further comprising an underfill adhesive material formed between the printed circuit board substrate and the semiconductor device to surround the fully closed solder waveguide shielding wall without intruding into the first waveguide aperture.

14. The packaged semiconductor device of claim 8, further comprising a patterned solder mask layer formed on the first surface of the printed circuit board substrate with a plurality of mask openings corresponding in location to the first plurality of landing pads and the trace lines.

15. The packaged semiconductor device of claim 8, where the patterned conductive layer comprises a patterned copper layer formed on the first surface of the printed circuit board substrate.

16. The packaged semiconductor device of claim 8, where the fully closed solder waveguide shielding wall comprises a plurality of reflowed solder balls which are attached to the first plurality of landing pads and trace lines to form a closed solder wall between the printed circuit board substrate and the semiconductor device to reduce signal leakage to and from any radio frequency signal transmitted through the first waveguide aperture.

17. The packaged semiconductor device of claim 8, where the fully closed solder waveguide shielding wall comprises a plurality of reflowed solder balls which form a closed solder wall ring having interior sidewalls that are substantially aligned with interior sidewalls of the first waveguide aperture.

18. An integrated circuit package assembly, comprising:
an integrated circuit chip package comprising a plurality of radio frequency coupling structures disposed on a first surface of the integrated circuit chip;
a carrier substrate comprising a plurality of waveguide openings which extend between first and second opposed surfaces of the carrier substrate and which are aligned, respectively, with the plurality of radio frequency coupling structures; and
a plurality of reflow solder waveguide shielding walls attaching the integrated circuit chip package to the carrier substrate and connected to a predetermined reference or ground voltage, where each reflow solder waveguide shielding wall is disposed around peripheral edges of a corresponding waveguide opening formed in the carrier substrate to at least substantially prevent signal leakage to and from any radio frequency signal transmitted through said corresponding waveguide opening.

19. The integrated circuit package assembly of claim 18, further comprising a patterned conductive layer formed on the first surface of the carrier substrate to define, around peripheral edges of each of the plurality of waveguide openings, a first plurality of copper landing pads connected to one another by copper trace lines.

20. The integrated circuit package assembly of claim 18, where each reflow solder waveguide shielding wall comprises a fully closed reflow solder waveguide shielding wall that fully surrounds the peripheral edges of the corresponding waveguide opening or a reflow solder waveguide shielding wall that includes a discontinuity or gap but still substantially surrounds the peripheral edges of the corresponding waveguide opening.

\* \* \* \* \*